United States Patent [19]
Chiba et al.

[11] Patent Number: 5,373,985
[45] Date of Patent: Dec. 20, 1994

[54] UPWARD SOLDERING METHOD

[75] Inventors: Hiromu Chiba, Kitakatsuragi; Makoto Kobayashi, Kawanishi, both of Japan

[73] Assignee: Matsushita Electric Industrial Co., Ltd., Kodama, Japan

[21] Appl. No.: 149,336

[22] Filed: Nov. 9, 1993

[30] Foreign Application Priority Data

Nov. 10, 1992 [JP] Japan .................. 4-299490

[51] Int. Cl.$^5$ .............................................. H05K 3/34
[52] U.S. Cl. .......................... 228/180.1; 228/234.1; 228/442
[58] Field of Search .............. 228/180.1, 234.1, 244, 228/41; 392/407, 419

[56] References Cited

U.S. PATENT DOCUMENTS

| | | | |
|---|---|---|---|
| 4,501,770 | 2/1985 | Bajka et al. | 427/97 |
| 4,842,352 | 6/1989 | Sasaki et al. | 336/83 |
| 5,289,966 | 3/1994 | Izumi et al. | 228/180.1 |

*Primary Examiner*—Samuel M. Heinrich
*Attorney, Agent, or Firm*—Cushman, Darby & Cushman

[57] ABSTRACT

A printed wiring board having an electronic component mounted thereon is disposed with a land of pattern directed downward, and the land and a lead terminal of the electronic component are irradiated with a light beam emitted upwardly and supplied with a solder forwarded upwardly.

6 Claims, 4 Drawing Sheets

UPWARD SOLDERING METHOD

FIELD OF THE INVENTION AND RELATED ART STATEMENT

1. Field of the Invention

The present invention relates to a method for soldering electronic components having lead terminals to a printed wiring board with an automatic soldering apparatus.

2. Description of the Related Art

In the generally-known conventional method for automatically soldering electronic components having lead terminals onto a printed wiring board, the soldering procedure is as follows:

(1) first, an electronic component is mounted on the printed wiring board with its lead terminals inserted into holes of the printed wiring board from a face opposite to a soldering face of the printed wiring board, (2) this electronic component is temporarily fixed on the printed wiring board together with a falling-off-prevention tool, (3) the printed wiring board is turned over so that the soldering face may be directed upward, (4) the lead terminals of the electronic component are soldered by a worker or a soldering robot with a soldering iron, and (5) the falling-off-prevention tool is removed, and the printed wiring board is forwarded to the next process.

Apart from the above-mentioned method, another soldering method has been applied to practical use recently. According to this soldering method, the soldering procedure is as follows:

(1) the printed wiring board is disposed with its soldering face directed upward, and solder cream is painted on predetermined soldering spots, (2) the printed wiring board is turned over so that the soldering face may be directed downward, (3) the electronic components each having the lead terminals are mounted onto the printed wiring board from the upper face, and the printed wiring board is held still in this state, and (4) the electronic components are soldered by being irradiated their soldering spots from a light source disposed under the printed wiring board.

However, in the above-mentioned conventional methods, there exist steps for turning over the printed wiring board. Therefore, complicated equipments are required for turning over the printed wiring board, and cost of the equipments must inevitably be high. Besides, a production line is elongated due to presence of the turning-over step. Furthermore, a step for fitting the falling-off-prevention tool for the electronic components on the printed wiring board is necessary only for the subsequent turning-over step. Since these steps make no contribution to the soldering itself, they are valueless in manufacturing processes.

If an upward soldering method were tried with a soldering iron, the melted solder would be liable to drop along the soldering iron. It would have therefore been difficult to realize good and stable soldering results by using the soldering iron.

OBJECT AND SUMMARY OF THE INVENTION

An object of the present invention is to offer an automatic soldering method that excludes valueless steps for the soldering.

In order to achieve the above-mentioned object, a soldering method of the present invention comprises steps of:

disposing a printed wiring board with solder-injection parts directed downward;

inserting lead terminals of an electronic component through respective holes formed in the solder-injection parts and holding the electronic component still;

upwardly irradiating one of the solder-injection parts and one of the lead terminals with a light beam to thereby heat them;

upwardly supplying a solder to the one of the solder-injection parts and the one of the lead terminals when a temperature of the one of the solder-injection parts and the one of the lead terminals reaches a melting point of solder; and irradiating the one of the solder-injection parts and the one of the lead terminals for a predetermined time period after stoppage of supplying the solder.

According to the above-mentioned upward soldering method, the solder-injection part and the lead terminal are locally heated and soldered without any step of turning over the printed wiring board. By the exclusion of the turning-over step, the soldering equipment is made simple, and its cost is low. Besides, a production line is shortened by omitting the turning-over step. Also, provision of the falling-off-prevention tool is not necessary, and the valueless step for attaching and detaching of the falling-off-prevention tool for the electronic component can be omitted. Furthermore, dust floating in the air is not attached on the melted solder because the soldering is carried out under the printed wiring board.

Thus, soldering of the printed wiring board has a high quality and a durability for a long while.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENT

Hereafter, a preferred embodiment of the present invention is described with reference to the accompanying drawings.

Figure 1:
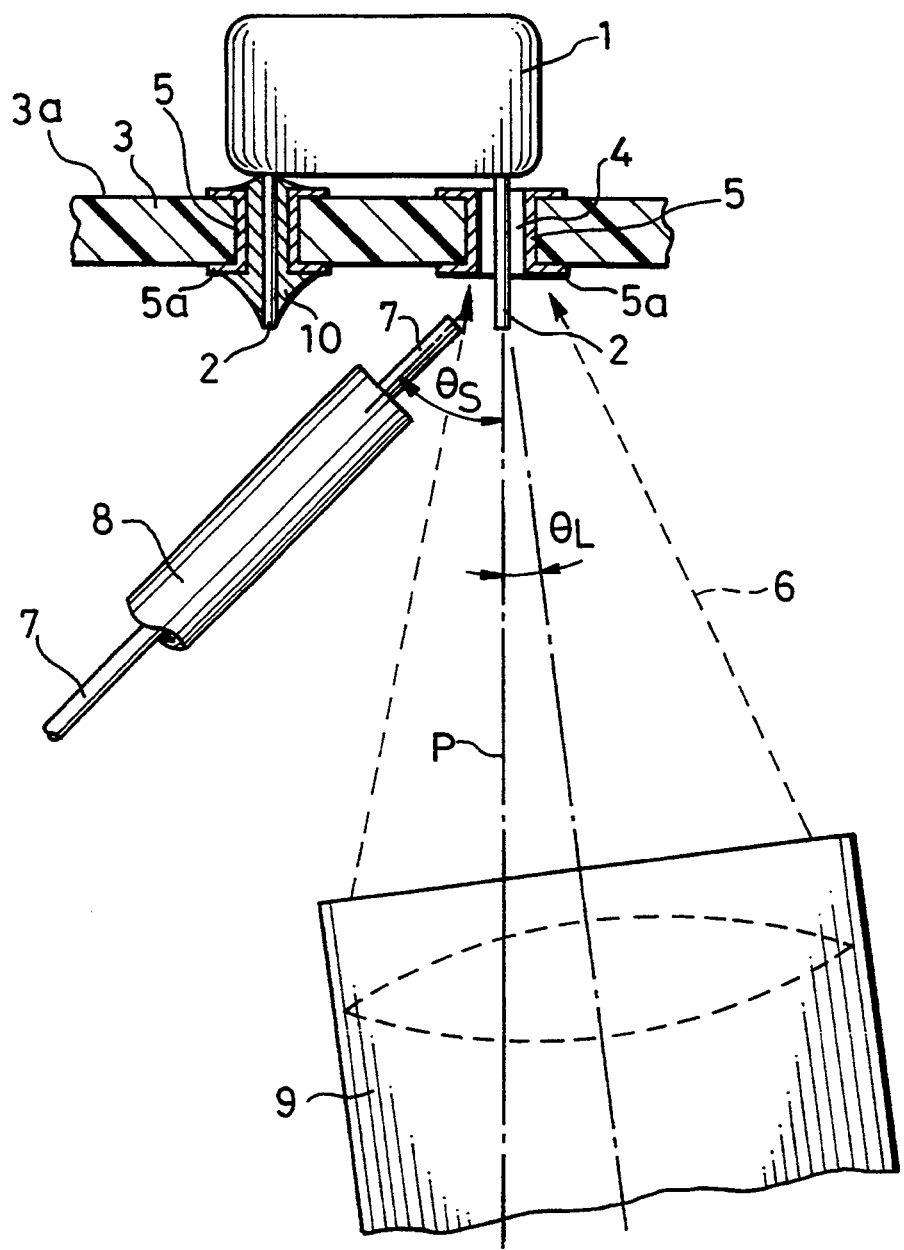
FIG. 1 is a partially cross-sectional view showing an arrangement of soldering tools and an electronic component to be soldered to a printed wiring board.

FIG. 1 is a partially cross-sectional view showing an arrangement of soldering tools and an electronic component 1 to be soldered to a printed wiring board 3. In FIG. 1, the printed wiring board 3 having patterns 5 mounted therein is disposed in a manner that a land 5a (solder-injection part) of the pattern 5 is directed downward. A pair of lead terminals 2 of the electronic component 1 are inserted into respective holes 4 from an upward face 3a of the printed wiring board 3. It is in a state after completion of soldering of the left one of the lead terminals 2 and before soldering of the right one of the lead terminals 2. A wire solder 7, which may contain flux, is supplied through a guide member 8. The guide member 8 is disposed to have a predetermined angle $\theta_S$ (not zero, e.g., from 20° to 80°) with respect to a line P perpendicular to the printed wiring board 3. If the angle is made zero, the soldering is undesirably influenced by a minute positional deviation of the lead terminal 2 when it is inserted into the printed wiring board 3. The lead terminals 2 and the pattern 5 are disposed above an optical lens device 9. An optical axis of the optical lens device 9 has a predetermined angle $\theta_L$ (including zero) with respect to the line P. This angle, hence an irradiation angle by a light beam 6, is variable within a certain range (e.g., from 0° to 50°). For instance, the light beam 6 is composed of a visible ray and an infrared ray emitted from a Xenon lamp.

Figure 2:
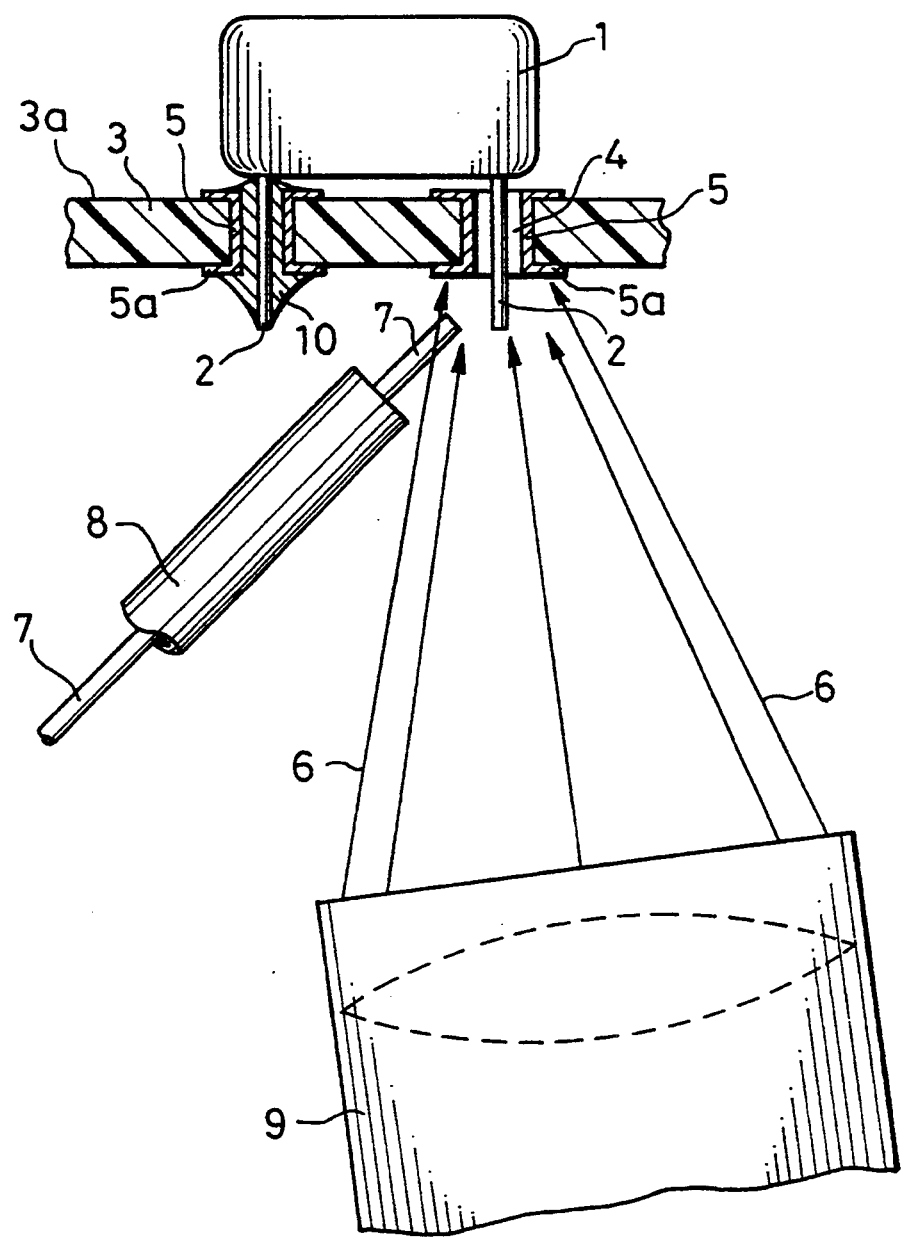
FIG. 2 is a view subsequent to a state of FIG. 1 showing a step of irradiation with a light beam.

From a state that the printed wiring board 3 is held as shown in FIG. 1, the light beam 6 is upwardly emitted from the optical lens device 9 as shown in FIG. 2. The land 5a of the pattern 5 and the lead terminal 2 are thereby irradiated by the light beam 6, thus being heated.

Figure 3:
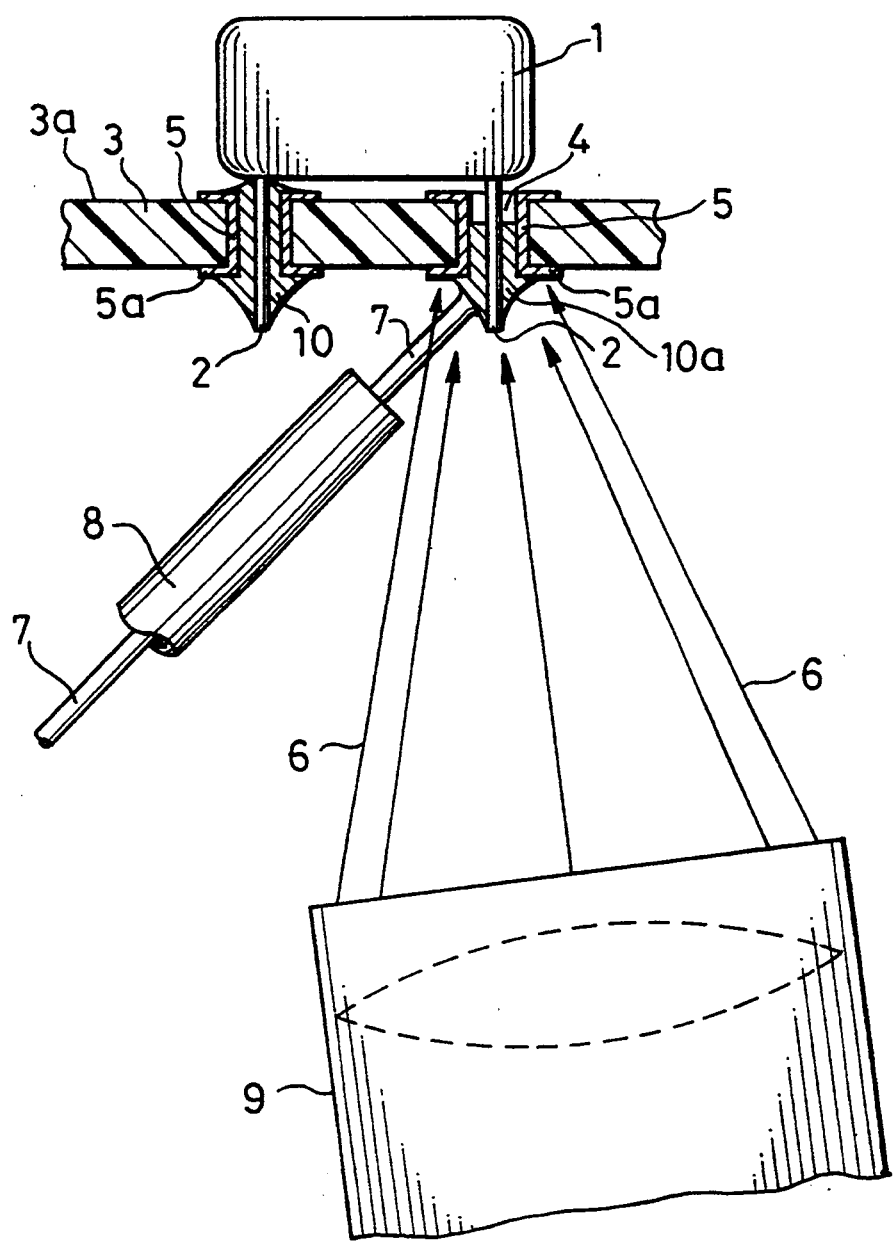
FIG. 3 is a view subsequent to a state of FIG. 2 showing a step of supplying a solder.
Figure 4:
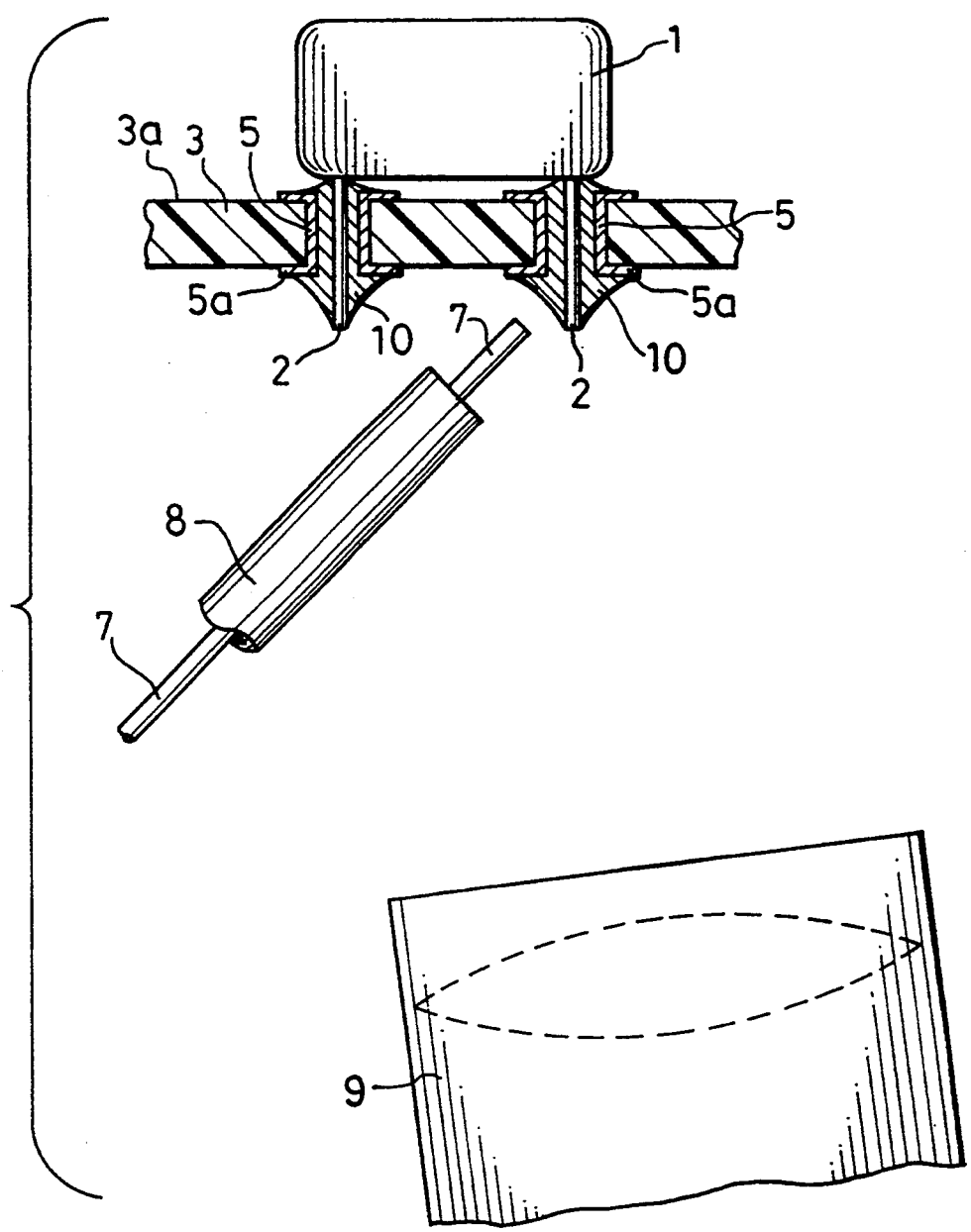
FIG. 4 is a view subsequent to a state of FIG. 3 showing a completed state of the soldering.

When a temperature of the pattern 5 and the lead terminal 2 reaches a melting point, the wire solder 7 is sent to the land 5a and the lead terminal 2. Then, as shown in FIG. 3, the wire solder 7 melts, and the lead terminal 2 and the pattern 5 are soaked with the melted solder 10a without any dropping of the melted solder. After stoppage of supply of the wire solder 7, emission of the light beam 6 is maintained for a predetermined time. When the melted solder 10a covers the whole surface of the pattern 5 and the lead terminal 2, thereby forming a fillet 10 as shown in FIG. 4, emission of the light beam 6 is stopped, thus completing a soldering work to this part.

Apart from the above-mentioned embodiment wherein the land 5a and the lead terminals 2 have no treatment thereon, another embodiment may be such that at least the land 5a is painted with flux and is coated with solder plating etc. beforehand. According to these treatments before the soldering, the melted wire solder 10a extends over the land 5a very easily and surely, thereby quickly forming the fillet 10. Therefore, dropping of the melted solder 10a (FIG. 3) is prevented perfectly.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims interpreted as covering all alterations and modifications as fall within the true spirit and scope of the invention.

What is claimed is:

1. An upward soldering method comprising the steps of:
    disposing a printed wiring board with solder-injection parts directed downward;
    inserting lead terminals of an electronic component through respective holes formed in said solder-injection parts and holding said electronic component still;
    upwardly irradiating one of said solder-injection parts and one of said lead terminals with a light beam to thereby heat them;
    upwardly supplying a solder to said one of the solder-injection parts and said one of the lead terminals when a temperature of said one of the solder-injection parts and said one of the lead terminals reaches a melting point of solder; and
    irradiating said one of the solder-injection parts and said one of the lead terminals for a predetermined time period after stoppage of supplying said solder.

2. An upward soldering method in accordance with claim 1, wherein
    said solder is supplied to said one of the solder-injection parts and said one of the lead terminals with a predetermined angle with respect to a line perpendicular to said printed wiring board.

3. An upward soldering method in accordance with claim 1, wherein
    said light beam has a predetermined irradiation angle including zero with respect to a line perpendicular to said printed wiring board.

4. An upward soldering method in accordance with claim 1, wherein
    at-least said solder-injection parts are painted with flux before said step of disposing.

5. An upward soldering method in accordance with claim 1, wherein
    at least said solder-injection parts are coated with solder plating before said step of disposing.

6. An upward soldering method in accordance with claim 1, wherein
    said light beam is emitted from a Xenon lamp.

* * * * *